Feb. 26, 1957 W. P. ROBINS 2,783,383
ELECTRIC OSCILLATION GENERATOR SYSTEMS
Filed May 18, 1954 2 Sheets-Sheet 1

INVENTOR
WILFRED PERCY ROBINS
BY
ATTORNEY

Feb. 26, 1957 W. P. ROBINS 2,783,383

ELECTRIC OSCILLATION GENERATOR SYSTEMS

Filed May 18, 1954 2 Sheets-Sheet 2

INVENTOR
WILFRED PERCY ROBINS
BY
ATTORNEY

United States Patent Office 2,783,383

Patented Feb. 26, 1957

2,783,383

ELECTRIC OSCILLATION GENERATOR SYSTEMS

Wilfred Percy Robins, Greenford, England, assignor to The General Electric Company Limited, London, England Application May 18, 1954, Serial No. 430,646

Claims priority, application Great Britain May 21, 1953

2 Claims. (Cl. 250—36)

Figure 1:
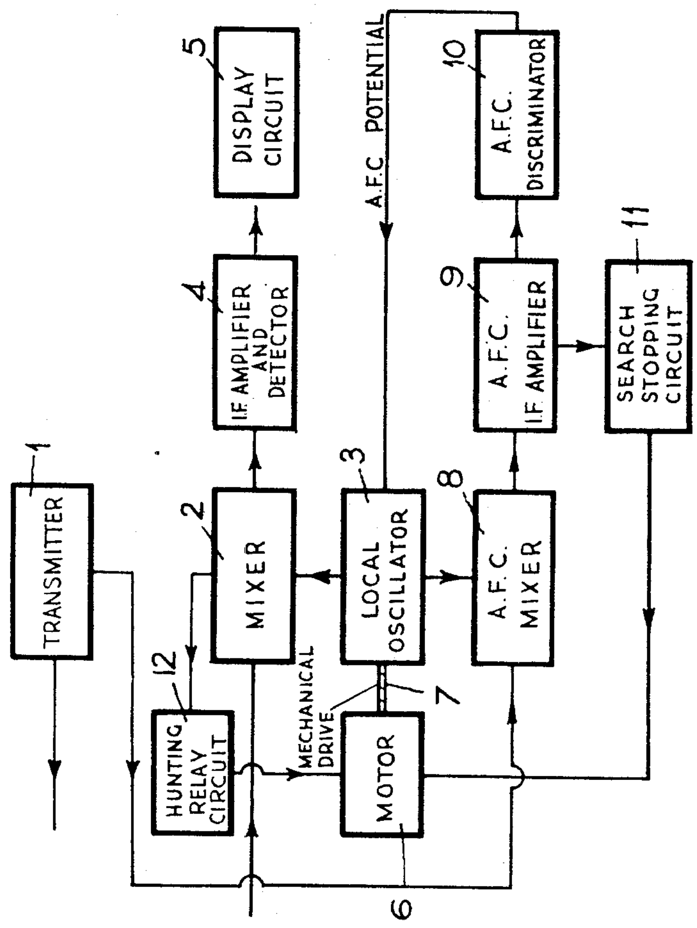

The present invention relates to electric oscillation generator systems of the kind including an electronic oscillator the frequency of which may be varied by means of both a mechanical and an electrical control, and an automatic frequency control system (the abbreviation A. F. C. system will be used henceforward in this specification) for maintaining the frequency of the oscillator as nearly as possible at a required constant difference to one side of the frequency of an input oscillation applied to the system, the A. F. C. system operating by varying one or both the oscillator frequency controls as necessary under different operating conditions. The oscillation generator system may form part for example of a superheterodyne type radio receiver, the oscillator being the local oscillator and the required constant difference of frequency between the oscillator and the input oscillation, in this case the received signals, being the intermediate frequency of the receiver.

In one well-known system of the kind specified, the electronic oscillator includes a reflex velocity modulated electron tube, the frequency of oscillation of which may be varied firstly by varying the size of a resonant cavity of the tube by means of one or more tuning plungers and secondly within limits by varying the potential on an electrode, usually the reflector electrode. For a given setting of the cavity tuning plungers, a number of modes of oscillation are usually obtained in these tubes as the reflector potential is varied, the power of the oscillations generated varying in each mode from zero through a maximum back to zero again as the potential alters in a typical case over a range of the order of 60 volts, the frequency varying by about 30 mc./s. over the mode. By means of the cavity tuning plungers, the centre frequency of a selected mode may be varied over a frequency band of approximately 1,000 mc./s. The operating conditions are usually such that only one selected mode is employed in operation.

The A. F. C. system includes as a fine control of the oscillator frequency, an electronic A. F. C. circuit comprising an A. F. C. mixer circuit, to which the input oscillation and an output from the oscillator are applied, an output from the A. F. C. mixer circuit, having a frequency equal to the difference between the frequencies of the input oscillation and the oscillator, being applied to a frequency discriminator circuit which generates an output potential varying approximately linearly through zero (or possibly some other datum value) over a limited range as the frequency of the input applied to it from the A. F. C. mixer circuit varies through the frequency equal to the constant difference it is required to maintain between the frequencies of the input oscillation and the oscillator. The output potential of the discriminator circuit is added to the potential applied to the tuning electrode of the oscillator tube, the sense of the variations being arranged so that any increase or decrease in the difference between the frequencies of the input oscillation and the oscillator away from the constant value is reduced towards zero by an appropriate variation of the oscillator frequency due to adjustment of the tuning electrode potential.

If the oscillator is a long way off tune, as for example may occur on the first occasion of operating after the oscillator tube has been replaced, the electronic A. F. C. circuit cannot operate, as the correct frequency of oscillation lies beyond the selected mode of the oscillator and/or the operative range of the discriminator circuit. Re-tuning by means of the cavity tuning plungers is then necessary. A reversible electric motor is provided, which, when the output from the mixer circuit exceeds a certain frequency, starts a search operation by driving one or more of the cavity tuning plungers so as to sweep the centre frequency of the selected mode backwards and forwards across the frequency band corresponding to that in which the frequency of the input oscillation may lie. A search stopping circuit is provided in addition which stops the operation of the motor when the frequency of the mixer unit output is such that the electronic A. F. C. circuit may operate the take over control of the oscillator frequency.

In addition, as a refinement, there may be provision for the motor to set up a hunting operation, i. e. an oscillation of small amplitude about the starting position, if, whilst the electronic A. F. C. system is in operation, the output power of the oscillator drops appreciably, due to operation towards one end of the selected mode. The motor, in hunting, causes the centre frequency of the selected mode to hunt slightly and ceases when the output power level is restored. During the hunting operation, the frequency variations lying within its range, the electronic A. F. C. circuit still controls the frequency of the oscillator to the required difference from the frequency of the input oscillation by varying the tuning electrode potential. This hunting operation may be initiated for example where for some reason a slow drift of the input oscillation frequency is occurring, and the electronic A. F. C. circuit has operated to control the oscillator frequency accordingly but to such an extent that the oscillator is operating towards one end of the selected mode and the output power is consequently low. Where the A. F. C. mixer circuit, or another mixer circuit to which an output from the oscillator is applied, for example the receiver mixer in a superheterodyne radio receiver, is a crystal mixer circuit, a relay responsive to the magnitude of the direct current component of the crystal current may be employed to control the hunting operation of the motor.

In the system described, the electronic A. F. C. system will produce an output potential not only when the oscillator frequency is at or near the required difference from that of the input oscillation, but also when it is at or near the image frequency, i. e. at the same frequency difference on the opposite side of the frequency of the input oscillations to that at which it is required to be. There is a distinction between the two cases however. Where a search operation is being carried out, if the frequency of the oscillator approaches the required frequency, at some point called the "pull-in frequency" the electronic A. F. C. circuit will commence to operate, pulling the frequency of the oscillator in to the required frequency by varying the tuning electrode potential. Assuming for the moment that the search stopping circuit did not operate, as the search motor continues to operate, the electronic A .F. C. circuit will maintain the oscillator frequency constant, until the motor has driven the cavity plunger to the point, called the "hold-in frequency," where the electronic A. F. C. circuit can no longer operate and the oscillator frequency then moves rapidly away from the required frequency and again varies under the control of the motor. If under similar circumstances the oscillator frequency approaches the image frequency, the electronic A. F. C. circuit operates to hold the oscillator frequency at a frequency, called the "hold-out frequency," at the edge of the circuit's operating range around the image frequency, the tuning electrode potential being varied by the A. F. C. circuit to oppose the frequency change due to the motor operation before the frequency reaches the image frequency. The hold-out frequency may be defined as the minimum possible difference between the oscillator frequency and the image frequency, for any possible input frequency. Subsequently, after the motor has driven the tuning plunger to a point corresponding to a frequency beyond the other end of that range, the electronic A. F. C. circuit can no longer act and the oscillator frequency moves rapidly through the image frequency and again varies under the control of the motor.

It will be apparent, that the search stopping circuit should only operate when the oscillator frequency is in the neighbourhood of the required frequency and not when it is near the image frequency. Previously the search stopping circuit has been controlled by potentials derived from the discriminator circuit, for example by a potential equal to the sum of the D. C. potentials produced by the two halves of the discriminator circuit, and it may well happen that even with the oscillator at the hold-out frequency a sufficient signal is applied to the discriminator to operate the search stopping circuit. The magnitude of the signal depends on the bandwidth of the mixer circuit and the succeeding I. F. amplifier stages from which the discriminator circuit is fed and of the discriminator itself, the width of the selected mode of the oscillator tube, and the loop gain of the electronic A. F. C. circuit. It is possible to adjust these variables so that the signal level is insufficient, but the tolerances required are close and not such that they may readily be reproduced in apparatus constructed on a production scale. If the adjustment is not made correctly it is possible in some arrangements for the system to operate so that the oscillator frequency is permanently locked within the band line between the image frequency and the nearer end of the search frequency band, thus never approaching the required frequency. This is obviously undesirable.

According to the present invention in an electric oscillation generator system of the kind specified including an electronic A. F. C. circuit for controlling the frequency of the electronic oscillator within relatively narrow limits by variation of the electrical frequency control in order to maintain the frequency of the output of a mixer circuit in the electronic A. F. C. circuit, which mixer circuit is fed with an output from the generator and the input oscillation, as nearly as possible at the required difference frequency, a motor, which is caused to operate when the frequency at the required difference from that of the input oscillation does not fall within said narrow limits, for driving the mechanical frequency control of the electronic oscillator so that its frequency searches continuously over a frequency range defined by much wider limits, and a search stopping circuit for stopping the motor when the frequency at the required difference from that of the input oscillation does fall within said narrow limits, the search stopping circuit is controlled by a signal derived from the mixer circuit of the electronic A. F. C. circuit (or a similar mixer circuit fed from the input oscillation and an output of the oscillator) through a signal circuit the bandwidth and Q factor of which are such that the signal is, under all normal operational conditions, considerably below the response level of the search stopping circuit when the oscillator is tuned to the hold-out frequency of the system. Preferably the signal level is at least 20 decibels below the response level of the search stopping circuit when the oscillator is tuned to the hold-out frequency.

The signal circuit for deriving a signal for controlling the search stopping circuit may comprise an amplifier or a passive signal network having the required bandwidth and Q factor, and a detector circuit coupled to the output of the amplifier, the search stopping circuit comprising a relay circuit controlled by an output from the detector circuit for stopping the motor search when the output from the detector exceeds a predetermined response level.

In a system in accordance with the present invention, it is necessary to ensure in addition that the search stopping circuit is not operated as the oscillator frequency passes rapidly through the image frequency after breaking away from the hold-out frequency. This necessitates the search stopping circuit being of an integrating nature so that it will not operate on a signal of less than a certain duration, determined to be greater than the duration of the signal obtained as the oscillator passes through the image frequency.

Where, as for example in the receiver of a pulse radar system, the input oscillation is pulsed, this requirement will resolve itself into a given minimum number of pulses which must be received before the search stopping circuit will operate.

In addition it is desirable that the search stopping circuit shall not release, thereby allowing the motor to recommence operation, during a temporary cessation or drop in level of the input oscillation. Again therefore an integrating nature is a requirement for the circuit.

There is however the complication that the operating time of the search stopping circuit must not exceed a certain maximum value dependent on the characteristic of the electronic A. F. C. circuit and on the speed of the motor and its overrun on switching off. Thus if the maximum speed of the motor is such that the oscillator frequency varies at $x$ mc./s., the hold-in range (i. e. the difference between the hold-in frequency and the required frequency) of the electronic A. F. C. circuit is $h$ mc./s., and the pull-in range (i. e. the difference between the pull-in frequency and the required frequency) is $p$ mc./s., the time taken for the variation of oscillator frequency to cease must not exceed $$\frac{p+h}{x}$$

seconds. If the motor overrun and operating time of the motor control relay are known, the maximum operating time for the search stopping circuit itself may be determined. The minimum operating time is determined as previously explained by the requirement that the circuit shall not operate on a signal of duration shorter than a predetermined minimum.

It is thus possible to determine limits within which the charging time constant of the integrating circuit of the search stopping circuit (assuming that to be the only part of which the operation is other than substantially instantaneous must lie. The discharging time constant must be large enough to fulfill the requirement that the circuit shall not release too rapidly. This latter point is especially important where the input oscillation is pulsed.

Figure 2:
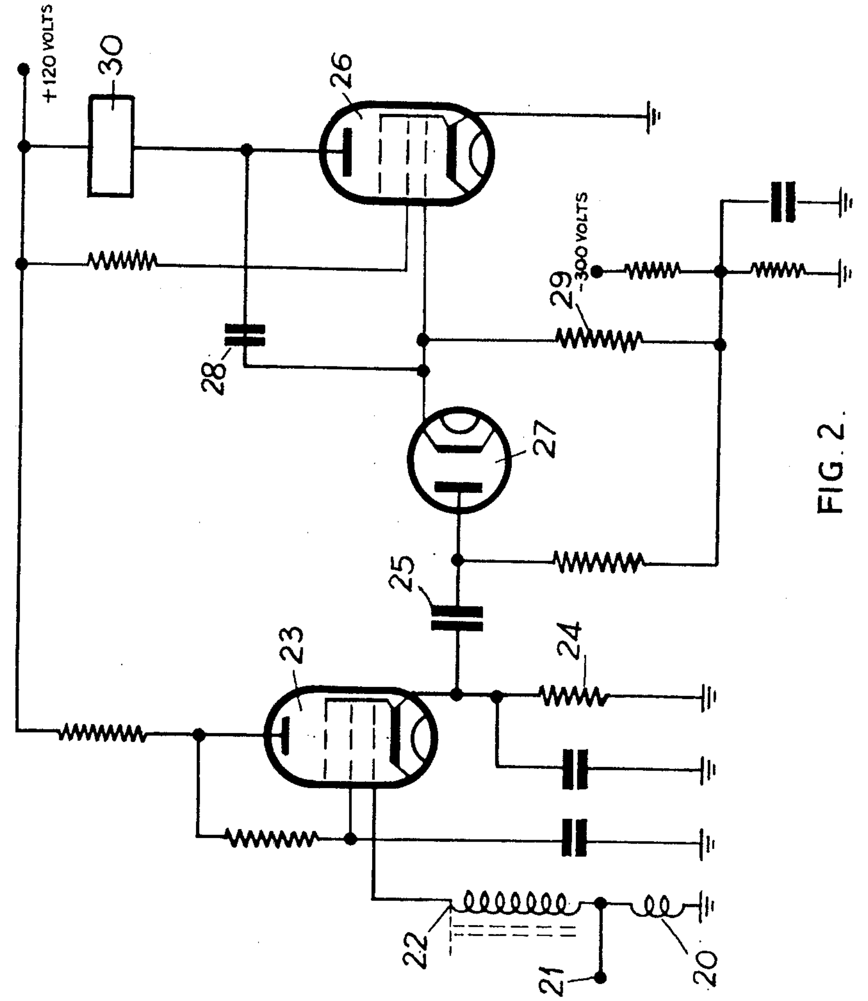

One example of an electric oscillation generator system in accordance with the present invention will now be described with reference to the accompanying drawings, in which Figure 1 shows a block circuit diagram of a pulse radar system including the system, and Figure 2 shows a detailed circuit diagram of the search stopping circuit.

Referring now to Figure 1 of the accompanying drawing, the radar system includes a transmitter 1 which generates recurrent high power pulses of oscillations at a frequency lying in the band 8600–9700 mc./s. The recurrence frequency and pulse length are variable in operation over a number of predetermined combinations, but the duty cycle, i. e. the ratio of pulse recurrence period to pulse length is of the order of 1000:1 in each case. The radio frequency parts of the system are designed to handle a broad band of frequencies, so that any frequency in the band of operation may be employed without the necessity for retuning, for example after replacing a magnetron oscillator valve in the transmitter 1, except of course on the part of the local oscillator which is retuned automatically. An output from the transmitter 1 is coupled to the aerial feeder system (not shown in the drawing).

Similarly the receiver mixer 2, normally a crystal mixer, is coupled to the aerial feeder, as well as to an output from the local oscillator 3. The output from the mixer 2 is fed to an I. F. amplifier and second detector 4, the I. F. amplifier being tuned to 45 mc./s., and the output from the second detector is fed to the video stages of the display circuits 5. The local oscillator 3 includes a reflex velocity-modulated electron tube of the kind in which the frequency is mainly determined by the size of a resonant cavity, the size being variable by means of screw-in tuning plungers. In addition variation of the reflector electrode potential, causes variation of the frequency of oscillation over a narrow range, about 50 mc./s., for any given setting of the tuning plungers. As the reflector potential is varied over a range appropriate to the selected mode of the tube, the power of the oscillations varies from zero through a maximum back to zero again.

An automatic frequency control system is provided automatically to maintain the frequency of the local oscillator 2 constantly 45 mc./s. (the intermediate frequency) below that of the transmitter 1. A motor 6 is provided which through a mechanical drive 7 can screw one of the tuning plungers of the oscillator tube over a range such that the whole frequency range required is covered. The motor 6 can operate in two ways, one a "search" operation in which the oscillator frequency is swept continuously backwards and forwards over the entire range. The other is a hunting operation, giving a slight oscillatory change of frequency by means of the mechanical control under certain circumstances.

An electronic A. F. C. circuit is also provided, which derives a variable potential applied to the reflector electrode of the oscillator tube, to vary the oscillator frequency in such a manner that any tendency to change the frequency of the output from the mixer 2 to the I. F. amplifier 4 is resisted by a change of the oscillator frequency.

The electronic A. F. C. circuit includes an A. F. C. mixer 8, which is fed from the transmitter 1 by a much attenuated output and from the local oscillator 3. The output is passed through an A. F. C. I. F. amplifier 9, having a fairly wide pass band centred on 45 mc./s., to the A. F. C. discriminator circuit 10, which in known manner derives a D. C. potential varying linearly through zero as the frequency of the input varies over a range of approximately 6 mc./s. about the centre frequency 45 mc./s. This potential is superimposed on the steady potential applied to the reflector electrode of the tube in the local oscillator 3.

In addition a search stopping circuit 11 is coupled to a stage in the A. F. C. I. F. amplifier 9. This circuit, described in detail below with reference to Figure 2, includes a relay which operates when signals of sufficient strength and duration are received. On operation of the relay, the search operation of the motor 6, which otherwise takes place, is discontinued and remains so as long as the relay is operated.

In the mixer 2, the direct current component of crystal current is proportional to the power of the oscillations applied from the local oscillator 3. If therefore the tube in the local oscillator, by virtue of variations in the A. F. C. potential, is caused to operate towards one end of the selected mode of oscillation, so that its power output decreases, the D. C. component of crystal current will decrease accordingly. In order to prevent this operation towards one end of the selected mode, a hunting relay circuit 12 is provided in which a relay is operated if the D. C. component of crystal current in the mixer 2 decreases below a predetermined value. This relay, when operated, causes the motor 6 to hunt slightly about its existing position, altering the position of the tuning plungers on the oscillator tube. When, during the hunting, the D. C. component of crystal current increases again, due to the movement of the tuning plungers shifting the position of the selected mode of the oscillator, the relay in the circuit 12 is released and the hunting ceases. This operation is useful where a slight drift of one of the frequencies concerned is occurring. This may occur steadily over a long period of time, for example, as a valve ages. The tube in the oscillator 3 is maintained in operation under efficient conditions, and a considerable slow drift can be followed without having recourse to the search operation of the motor 6.

As explained previously, it is necessary that the circuits, through which signals are fed to the search stopping circuit 11, should have frequency characteristics such that at the hold-out frequency of the electronic circuit, the signal strength applied to the search stopping circuit is considerably below the response level.

Referring now also to Figure 2 of the accompanying drawing, it will be seen that the input circuit of the search stopping circuit, includes a small coupling inductance 20, connected across the input terminal 21 and earth. This forms part of a common inductance coupling to a stage in the I. F. amplifier 9, such that the search stopping circuit 11 is loosely coupled to the amplifier 9. A pre-set dust cored inductance 22 is connected between the terminal 21 and the control grid of a pentode 23 connected as an "infinite impedance" detector. The inductance 22, with the inter-electrode capacitance of the pentode 23, forms a circuit resonant at the intermediate frequency of the system, namely 45 mc./s. and is loosely coupled to a tuned circuit in one stage of the I. F. amplifier 9 by the inductance 20. The Q factor of the coil is chosen so that, at the hold-out range of the electronic A. F. C. circuits, the level of the signal passed to the detector formed by the circuit of the pentode 23 is 30 decibels below the level necessary to actuate the circuit.

The output from the detector, taken from across the cathode load 24 of the pentode 23, is coupled by means of a coupling capacitance 25 to a Miller integrating circuit, formed by the circuit of the pentode 26, a low impedance diode 27 being included in the input to the integrating circuit. The diode 27 is included to give the required difference between the charge and discharge time constants of the integrating circuit. During charging periods, the diode 27 is conducting, and the capacitance 28, connected between the control grid and the anode of the pentode 26, is charged through a resistance comprising the output impedance of the detector and the forward impedance of the diode 27, a resistance which can be only a few hundred ohms. During discharge periods the diode 27 is non-conducting, and the capacitance 28 discharges through the grid leak resistance 29, which is made as high as is practicable, i. e. of the order of 2 megohms. The operating winding of the motor control relay 30 is connected as the anode load of the pentode 26, and is operated when a sufficiently large signal is applied to the search stopping circuit for sufficient time. The grid bias of the pentode 26, which must be accurately determined, is derived from a close tolerance resistance network connected across a source of negative potential and earth.

The calculation of the time constants in one specific system, will now be given by way of example. The parameters of the system were:

Pulse recurrence frequency 1500 per second
Duty ratio 1000:1
Width of local oscillator mode variable between ±36 mc./s. and ±14 mc./s. (the variation being from one valve to another of the same type)
Hold-in range approximately variable between ±34 mc./s. and ±12 mc./s.
Pull-in range ±6 mc./s.
Hold out range ±5 mc./s.
Motor at maximum speed gives tuning at 100 mc./s.
Intermediate frequency 45 mc./s.

To provide a signal level 30 dbs down at 5 mc./s. off tune, the Q of the tuned circuit should be 130 approx.

To provide a signal level 23 dbs down at 5 mc./s. off tune, the Q of the tuned circuit should be 70 approx. In a pulsed system this is influenced by the width and shape of the pulse spectrum, but the safety margin remains large. The difference in levels which must exist depends on the variation of the various signal levels which may occur within the tolerances permitted by the design of the system. Relay operating time=5 milliseconds motor overrun equivalent to 50 milliseconds operation at full speed—Total delay=55 milliseconds.

The maximum possible time constant varies between $$1000\frac{(34+6)}{100}-55 \text{ and } 1000\frac{(12+6)}{100}-55 \text{ milliseconds}$$

(variation being due to variation of hold-in range from one valve to the next) i. e. varies between 345 and 125 milliseconds.

The minimum value of this must be taken i. e. 125 milliseconds. As the duty ratio=1000:1, the maximum time constant for charging=125 microseconds. If the circuit is to operate on, say, not less than 10 pulses, its time constant must not be less than 7 microseconds (approx). Thus the charging time constant must be in the range 125–7 microseconds.

Let us assume 15 microseconds is chosen. (This is taken as a convenient value rather nearer the minimum so that when the motor eventually stops, the oscillator is at a point on its mode at which the output is fairly high. Otherwise there is a risk that the output may be low, and that the signal then reaching the search stopping circuit would for that reason be too low to hold it operated.)

Charging resistance=output impedance of detector + forward impedance of diode 27=350 ohms approx.

∴required capacitance=

$$\frac{15\times10^6}{10^6\times350}\mu f \text{ (in a simple RC circuit}=0.042\mu f$$

Gain of pentode 26=18 approx. ∴capacitance 28=2200μμ f. approx. Highest practicable value of grid leak resistor 29=2.2 M-ohms ∴discharge time constant=0.1 second approx.

It will be appreciated that in the system described with reference to Figures 1 and 2, the search stopping circuit is fed from the mixer circuit of the electronic A. F. C. circuit, as a matter of convenience and economy in design. It is not essential that it is fed from this particular mixer circuit, and any other equivalent mixer circuit fed with an output from the oscillator and part of the input oscillations could be employed instead to feed signals of the required frequency to the input of the search stopping circuit. This other mixer circuit might be entirely separate and employed only for this one purpose.

I claim:

1. In an electric oscillation generator system of the kind including an electronic oscillator having both a mechanical and an electrical frequency control, the latter enabling the frequency of the oscillator to be varied over a narrow band of frequencies centered about a frequency set by the former, and an automatic frequency control system for maintaining the frequency of the oscillator as nearly as possible at a required constant difference to one side of the frequency of an input oscillation, the automatic frequency control system including a motor for driving the mechanical frequency control so that the frequency of the oscillator is varied continuously across the complete band of frequencies in which it is required to operate, an electronic automatic frequency control circuit fed with an output from the oscillator and part at least of the input oscillations and comprising a mixer circuit for deriving an oscillation having a frequency equal to the difference of the frequencies of the two oscillations applied to it and a feedback loop responsive to the frequency of the output from the mixer circuit for varying the electrical frequency control of the oscillator to vary the frequency of oscillation over said narrow band of frequencies, to bring the frequency of the output from the mixer circuit to the required constant frequency difference, and a search stopping circuit for stopping the motor when the frequency of the output from the mixer circuit is close to the required constant frequency difference, the search stopping circuit is fed with a signal from the mixer circuit and includes an input circuit including a frequency-sensitive signal translating circuit tuned to the required constant frequency difference and a detector relay circuit coupled to an output from the signal translating circuit and including means for operating a relay to stop the motor when the output from the signal translating circuit exceeds a predetermined level, the signal translating circuit having a bandwidth and Q factor such that, when the oscillator is held at a frequency (the hold-out frequency), which is determined by the characteristics of the electronic automatic frequency control circuit near the frequency at the required constant frequency difference to the other side of the frequency of the input oscillation, the level of the signal applied to the detector relay circuit is insufficient to operate it.

2. An electric oscillation generator comprising an electronic oscillator having both a mechanical and an electrical frequency control and an automatic frequency control system for maintaining the frequency of the oscillator as nearly as possible at a required constant difference to one side of the frequency of an input oscillation, the automatic frequency control system comprising a motor to tune the oscillator across the band of frequencies in which it is required to operate by driving the mechanical frequency control, an electronic automatic frequency control circuit which is fed with an output from the oscillator and part at least of the input oscillations and which comprises a mixer circuit for deriving an oscillation having a frequency equal to the difference of the frequencies of the two oscillations applied to it and a feedback loop responsive to the frequency of the output from the mixer circuit for varying the electrical frequency control of the oscillator to bring the frequency of the output from the mixer circuit to the required constant frequency difference, and a search stopping circuit for stopping the motor when the frequency of the output from the mixer circuit is close to the required constant frequency difference, the search stopping circuit comprising a relay operable to stop the motor, a frequency-sensitive signal translating circuit which is tuned to the required constant frequency difference and to which is supplied a portion of the output from the mixer, and means for operating the relay to stop the motor when the output from the frequency-sensitive signal translating circuit exceeds a predetermined level, this level being such that the means is not operated to stop the motor when the frequency of the oscillator is controlled by the electronic automatic frequency control circuit to the hold-out frequency.

References Cited in the file of this patent

UNITED STATES PATENTS 2,605,425 Hugenholtz ____________ July 29, 1952